United States Patent
Doany et al.

(10) Patent No.: US 9,229,169 B2
(45) Date of Patent: Jan. 5, 2016

(54) LENS ARRAY OPTICAL COUPLING TO PHOTONIC CHIP

(75) Inventors: Fuad E. Doany, Katonah, NY (US); Benjamin G. Lee, New York, NY (US); Clint L. Schow, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1060 days.

(21) Appl. No.: 13/211,018

(22) Filed: Aug. 16, 2011

(65) Prior Publication Data

US 2013/0084039 A1    Apr. 4, 2013

(51) Int. Cl.
G02B 6/32    (2006.01)
H01L 21/302    (2006.01)
G02B 6/30    (2006.01)
G02B 6/42    (2006.01)

(52) U.S. Cl.
CPC .. *G02B 6/32* (2013.01); *G02B 6/30* (2013.01); *G02B 6/4204* (2013.01); *G02B 6/425* (2013.01); *G02B 6/4244* (2013.01); *H01L 21/302* (2013.01)

(58) Field of Classification Search
CPC ...... G02B 6/30; G02B 6/4204; G02B 6/4244; G02B 6/425; H01L 21/302
USPC ............................................... 385/33; 438/32
See application file for complete search history.

(56) References Cited

U.S. PATENT DOCUMENTS

| | | | |
|---|---|---|---|
| 4,220,411 A * | 9/1980 | Cowen | 356/73.1 |
| 4,867,371 A | 9/1989 | Davis et al. | |
| 4,877,175 A * | 10/1989 | Jones et al. | 228/102 |
| 4,944,567 A * | 7/1990 | Kuper et al. | 385/31 |
| 5,054,877 A * | 10/1991 | Ortiz et al. | 385/33 |
| 5,319,725 A * | 6/1994 | Buchmann et al. | 385/14 |
| 5,346,583 A * | 9/1994 | Basavanhally | 216/26 |
| 5,379,360 A * | 1/1995 | Ota et al. | 385/59 |
| 5,420,722 A * | 5/1995 | Bielak | 359/708 |
| 5,790,730 A | 8/1998 | Kravitz et al. | |

(Continued)

FOREIGN PATENT DOCUMENTS

JP    05005857 A  *  1/1993    ............. G02B 27/00

OTHER PUBLICATIONS

Nakagawa, G., et al. "Highly Efficient Coupling Between LD Array and Optical Fiber Array Using SI Microlens Array" IEEE Photonics Technology Letters, vol. 5, No. 9. Sep. 1993. pp. 1056-1058.

(Continued)

*Primary Examiner* — Peter Radkowski
(74) *Attorney, Agent, or Firm* — Tutunjian & Bitetto, P.C.; Anne V. Dougherty

(57) ABSTRACT

A photonic integrated circuit apparatus is disclosed. The apparatus includes a photonic chip and a lens array coupling element. The photonic chip includes a waveguide at a side edge surface of the photonic chip. The lens array coupling element is mounted on a top surface of the photonic chip and on the side edge surface. The coupling element includes a lens array that is configured to modify spot sizes of light traversing to or from the waveguide. The coupling element further includes an overhang on a side of the coupling element that opposes the lens array and that abuts the top surface of the photonic chip. The overhang includes a vertical stop surface that has a depth configured to horizontally align an edge of the waveguide with a focal length of the lens array and that vertically aligns focal points of the lens array with the edge of the waveguide.

19 Claims, 12 Drawing Sheets

(56) References Cited

U.S. PATENT DOCUMENTS

| | | | |
|---|---|---|---|
| 5,943,463 A * | 8/1999 | Unuma et al. | 385/119 |
| 6,056,448 A * | 5/2000 | Sauter et al. | 385/92 |
| 6,064,786 A * | 5/2000 | Cunningham et al. | 385/38 |
| 6,095,697 A | 8/2000 | Lehman et al. | |
| 6,328,479 B1 * | 12/2001 | Schofield et al. | 385/65 |
| 6,333,208 B1 | 12/2001 | Li | |
| 6,860,648 B2 * | 3/2005 | Jin et al. | 385/89 |
| 6,866,426 B1 * | 3/2005 | Steinberg et al. | 385/83 |
| 6,931,181 B2 * | 8/2005 | Jewell et al. | 385/49 |
| 6,985,506 B2 * | 1/2006 | Lissotschenko | 372/50.1 |
| 6,985,645 B2 * | 1/2006 | Cohen et al. | 385/14 |
| 7,027,687 B2 | 4/2006 | Kishima | |
| 7,063,587 B1 * | 6/2006 | Lin | 446/124 |
| 7,128,476 B1 | 10/2006 | Boudreaux et al. | |
| 7,251,398 B2 | 7/2007 | Baets et al. | |
| 7,303,339 B2 | 12/2007 | Zhou et al. | |
| 7,324,717 B2 * | 1/2008 | Chua et al. | 385/14 |
| 7,352,924 B2 | 4/2008 | Gaebe et al. | |
| 7,454,105 B2 | 11/2008 | Yi et al. | |
| 7,548,669 B2 | 6/2009 | Nakagawa | |
| 7,553,088 B2 | 6/2009 | Nakajima | |
| 7,702,197 B2 | 4/2010 | Nakagawa | |
| 8,554,026 B2 * | 10/2013 | Chang et al. | 385/14 |
| 2003/0231828 A1 | 12/2003 | Brock et al. | |
| 2004/0057677 A1 * | 3/2004 | Jacobowitz et al. | 385/89 |
| 2005/0063634 A1 * | 3/2005 | Cohen et al. | 385/14 |
| 2005/0123246 A1 * | 6/2005 | Morse et al. | 385/53 |
| 2007/0126010 A1 * | 6/2007 | Chua et al. | 257/79 |
| 2007/0206908 A1 * | 9/2007 | Cohen et al. | 385/92 |
| 2007/0274630 A1 | 11/2007 | Ghiron et al. | |
| 2008/0226229 A1 * | 9/2008 | Nakagawa | 385/33 |
| 2008/0285920 A1 | 11/2008 | Budd et al. | |
| 2009/0226130 A1 | 9/2009 | Doany et al. | |
| 2011/0052114 A1 | 3/2011 | Bernasconi et al. | |
| 2011/0235967 A1 * | 9/2011 | Chang et al. | 385/27 |

OTHER PUBLICATIONS

Schares, L., et al. "Terabus: Terabit/Second-Class Card-Level Optical Interconnect Technologies" IEEE Journal of Selected Topics in Quantum Electronics, vol. 12, No. 5. Sep. 2006. pp. 1032-1044.

* cited by examiner

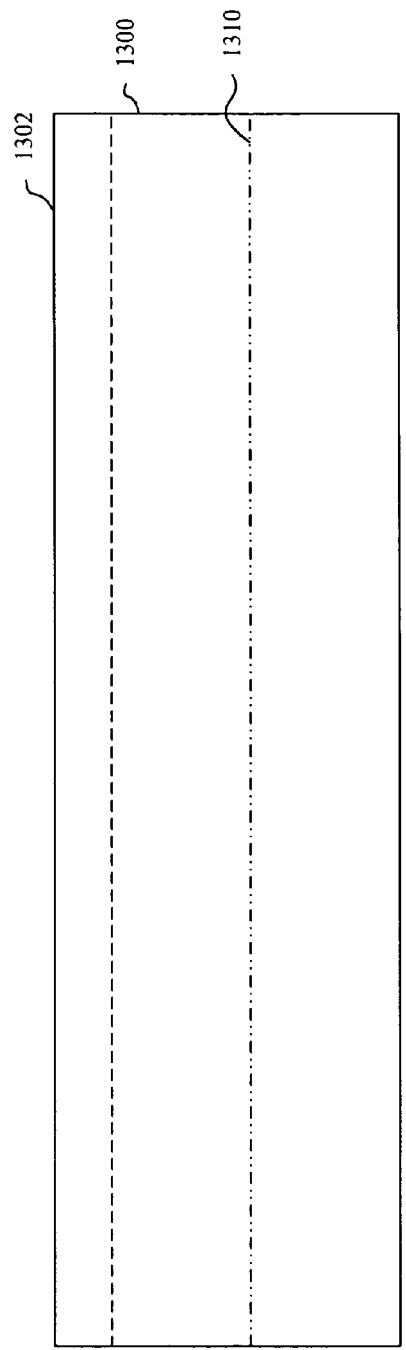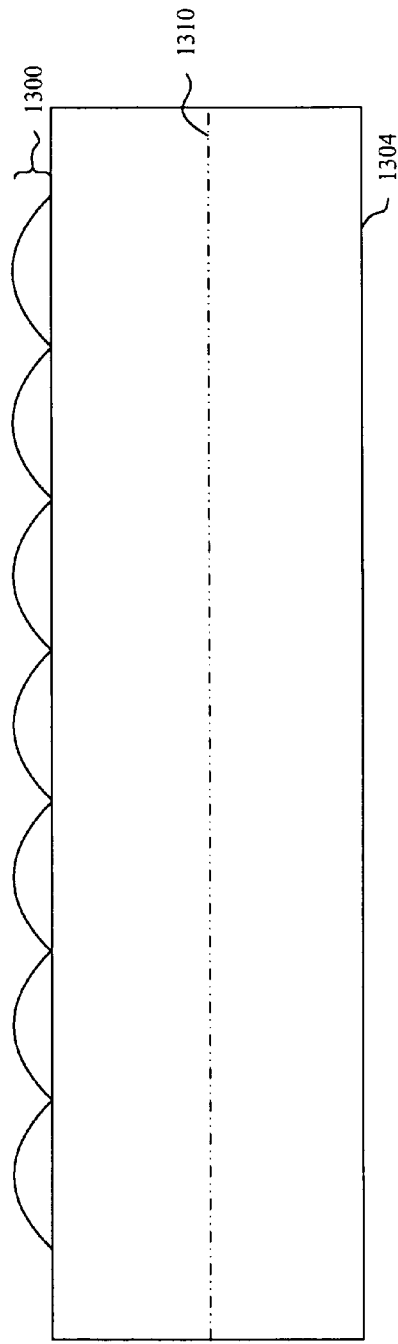
FIG. 13
FIG. 14

LENS ARRAY OPTICAL COUPLING TO PHOTONIC CHIP

GOVERNMENT RIGHTS

This invention was made with Government support under Contract No.: HR0011-08-C-0102 (Defense Advanced Research Projects Agency (DARPA)). The Government has certain rights in this invention.

BACKGROUND

1. Technical Field

The present invention relates to photonic integrated circuits, and, more particularly, to optical couplings to photonic integrated circuits.

2. Description of the Related Art

Photonic chips are part of an emerging technology that uses light as a basis of operation as opposed to an electric current. Photonic chips are expected to be a fundamental building block of interconnect networks in future computers that offer faster processing speeds with low power consumption. Furthermore, photonic circuits could be directly incorporated into processor chips to achieve tight integration of electronic and photonic circuits. An advantage of using light as a basis of circuit operation is that its energy cost for high-speed signal transmission is substantially less than that of electronic chips. Thus, efficient coupling between photonic chips and other optical devices, such as fibers, that maintains this advantage is an important aspect of photonic integrated circuits.

SUMMARY

One embodiment is directed to a photonic integrated circuit apparatus that includes a photonic chip and a lens array coupling element. The photonic chip includes a waveguide that has apertures at a side edge surface of the photonic chip. The lens array coupling element is mounted on a top surface of the photonic chip and on the side edge surface. The coupling element includes a lens array that is configured to modify spot sizes of light traversing to or from the waveguide. The coupling element further includes an overhang on a side of the coupling element that opposes the lens array and that abuts the top surface of the photonic chip. The overhang includes a vertical stop surface that has a depth configured to horizontally align an edge of the waveguide with a focal length of the lens array and that vertically aligns focal points of the lens array with the edge of the waveguide.

An alternative embodiment is directed to a photonic integrated circuit coupling system that includes a photonic chip, an other optical device and a lens array coupling element. The photonic chip includes a waveguide that has apertures at a side edge surface of the photonic chip. In addition, the other optical device is configured to transmit or receive light to or from the apertures of the waveguide. The lens array coupling element is mounted on a top surface of the photonic chip and on the side edge surface. The coupling element includes a lens array that is configured to modify spot sizes of the light traversing between the waveguide and the other optical device. The coupling element further includes an overhang on a side of the coupling element that opposes the lens array and that abuts the top surface of the photonic chip. The overhang includes a vertical stop surface that has a depth that is configured to horizontally align an edge of the waveguide with a focal length of the lens array and that vertically aligns focal points of the lens array with the edge of the waveguide.

Another embodiment is directed to photonic chip coupling device that includes two portions. A first portion includes at least one lens that is configured to modify a spot size of light traversing between an optical device and a waveguide that is at a side edge surface of a photonic chip and that directs light horizontally. The second portion is on an opposing side of the coupling device with respect to the first portion. Further, the second portion includes an overhang with a first surface having a depth configured to horizontally align an edge of the waveguide with a focal length of the at least one lens. The first surface is further configured to abut a top surface of the photonic chip and act as a vertical stop such that the overhang vertically aligns a focal point of the at least one lens with the edge of the waveguide at the side edge surface of the photonic chip.

An alternative embodiment is directed to a method for manufacturing a photonic integrated circuit apparatus. In accordance with the method, a lens array is fabricated on a first surface of a substrate. Further, an overhang is etched on a second surface of the substrate that opposes the first surface of the substrate, where overhang includes a vertical stop surface and an edge stop surface. The second surface is aligned to a side edge surface of a photonic chip by employing the depth of the vertical stop surface to horizontally align an edge of a waveguide that directs light horizontally to or from the side edge surface with a focal length of the lens array and employing the vertical stop surface to vertically align focal points of the lens array with the edge of the waveguide. The overhang is bonded to the photonic chip such that the vertical stop surface is abutted to a top surface of the photonic chip and the edge stop surface is abutted to the side edge of the photonic chip.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIGS. 13-16 are diagrams that illustrate the fabrication of a lens array photonic chip coupling element in accordance with one exemplary embodiment.

DETAILED DESCRIPTION OF PREFERRED EMBODIMENTS

Figure 1:
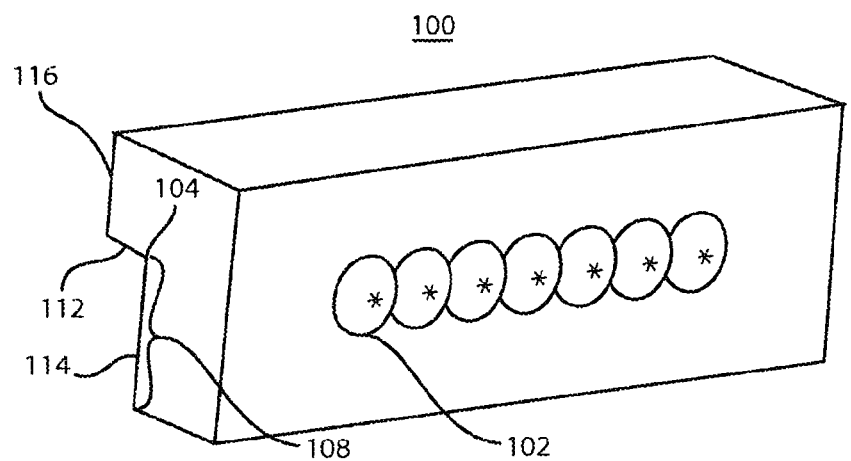
FIG. 1 is a three-dimensional view of a lens array photonic chip coupling element in accordance with one exemplary embodiment.

An economical aspect of photonic chips is that they can be manufactured by employing standard techniques and processes that are utilized in the fabrication of CMOS (complementary metal-oxide-semiconductor) devices. For example, photonic chips with integrated waveguides can be made by using CMOS processes. Silicon photonic circuits typically use silicon waveguides less than 0.5 µm in size for active photonic circuitry, such as modulators, detectors and switches. However, to efficiently couple the chip to other devices, such as single mode fibers, the spot size of the light that traverses out of the waveguides should be converted to larger dimensions for off-chip devices that have a lower numerical aperture. On-chip waveguides are typically fabricated in SiN or SiON with dimensions of approximately 1 µm×2 µm to provide compatibility with standard CMOS processes, as a scale that is much greater than 1 µm height is generally not compatible with CMOS processes. However, the numerical apertures of these on-chip waveguides are still relatively high compared to, for example, standard single-mode fibers (SMF) that are used to couple the chip to other devices. Thus, due to the large difference in spot size and numerical aperture characteristics between photonic waveguides and fibers, optical couplings between the integrated waveguides and the fibers are very inefficient.

To address this problem, butt couplings between the integrated waveguides and off-chip devices can be made with specialty fibers that have dimensions and numerical aperture characteristics that are similar to those of the waveguide. However, specialty fibers are costly and require a very high precision (less than 0.5 µm) for both alignment and fabrication of the fiber to fiber array. Embodiments described herein below provide an alternative means to lower the numerical aperture characteristics of the on-chip waveguide and to implement a spot-size conversion for a coupling between the on-chip waveguide and a larger core SMF, or an external waveguide or other off-chip optical element. In accordance with one exemplary aspect, a lens array can be employed to implement the spot size conversion. In particular, embodiments described herein are directed to an efficient and elegant means for aligning the lens array with a waveguide that is at a side edge surface of a photonic chip and that directs light horizontally. To implement the alignment, embodiments utilize a vertical stop surface that both horizontally aligns an edge of the waveguide with a focal length of the lens array and vertically aligns focal points of the lens array with the edge of the waveguide.

Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of systems, apparatuses, methods and devices according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture having a wafer; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit photonic chip and one or more lens array coupling elements may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips with lens array couplings. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a lens array coupling element 100 in accordance with an exemplary embodiment of the present principles is illustrated. As illustrated in FIG. 1, the coupling element can include an array 102 of lenses and an overhang 104 that is on a side of the coupling element that opposes the lens array 102.

The lens array element 100 can provide an efficient coupling between an integrated waveguide array and a fiber array or another optical device. Typically, SiN or SiON waveguides have a numerical aperture that is greater than 0.4 with a rectangular core that has an area of about 1 μm×2-3 μm, while a standard SMF has a numerical aperture of approximately 0.1 and a core diameter of between 8-9 μm. The lens array 102 can provide a spot-size conversion that matches the SMF with high efficiency, while the overhang 104 can provide a simple and elegant means of precisely matching both the focal length of the lens array and the vertical positioning of the lens array with the edge of the waveguide.

In accordance with one embodiment, a lens in the array 102 can be designed to provide magnification of four to five times between the waveguide and the SMF. The spot-size of a 1×2 μm waveguide at the edge of the photonic chip can be magnified to about 4×8 μm or 5×10 μm to better match the core dimension of the SMF, which is approximately between 8-9 μm. Furthermore, the numerical aperture (NA) is simultaneously reduced by a factor of 4 to 5 to match the NA of the SMF. The lens array 104 can be constructed with a pitch that is identical to the photonic waveguide array integrated onto the edge of the photonic chip to provide a means for efficient coupling to a standard SMF array, or other optical devices. Here, each lens array coupling element 100 can be customized for a given waveguide and multiple coupling elements 100 can be employed on the same photonic chip to accommodate a plurality of corresponding waveguides on the chip. The lens array 102 can be linear and can have a pitch that is approximately 250 μm. 250 μm is a typical pitch of fiber arrays, although other waveguide and fiber pitches between 50 μm to 1 mm can be employed.

While the benefits of employing a lens array to convert the spot-size of light between the waveguide and off-chip devices are significant, they are difficult to achieve due to the challenges associated with aligning the lens array in the proper position with respect to the edge of the waveguide. For example, referring to FIG. 2, with continuing reference to FIG. 1, an edge view of a photonic chip 200 and an integrated waveguide 202 is illustrated. A top view of the photonic chip 200 and the waveguide 202 is illustrated in FIG. 3. Here, the integrated waveguide 202 has apertures at the edge 206 of the photonic chip and is designed to route light to or from the edge 206 of the photonic chip horizontally. The waveguide array 202 is fabricated on an internal layer a few microns below the top surface 208 of the chip 200. The waveguide 202 is considerably different from surface-normal waveguides that route light to or from the top surface 208 of the photonic chip, which has the largest exposed surface area of the chip. The edge directed waveguides permit the use of larger integrated circuits to ease horizontal coupling between different devices on one or more substrates. Here, as opposed to using complex assembly tooling techniques to properly align and couple the lens array to the edge of the photonic chip, the overhang 104 can be employed to accurately position the lens array. In particular, as indicated above, the overhang 104 can provide a mechanical reference or stop to align both the focal length of the lens array and the vertical position of the focal points of the lens array with the edge of the waveguide in a substantially simplified manner. For example, the depth 106 of the overhang 104 can align the edge 204 of the waveguide to the focal length ($f_1$) of the lens array 102, while the height 108 of surface 114 of the overhang 104 can vertically align the focal points of the lens array to the corresponding edges of the channels 210 of the waveguide 202. As such, the surface 112 acts as a vertical stop surface that has a depth configured to horizontally align an edge of the waveguide with a focal length of the lens array and that vertically aligns focal points of the lens array with the edge of the waveguide. Accordingly, by employing the edges of the overhang 104 in this way, the alignment and attachment of the lens array to the edge of the photonic chip 200 can be significantly simplified, thereby enabling simplified coupling of various optical device elements through lens arrays during the fabrication of photonic circuits. Lens array element 100 can have twelve lens elements at a 250 μm pitch, which matches standard fiber arrays. At a 250 μm pitch, dimensions of element 100 may be about 0.5 mm×3 mm. The lens elements may have diameters of about 200 μm. However, the number of lens elements can be from 2 to 100, with a pitch that is between 50 μm and 1 mm. The focal length can typically be in the range of 50 μm to 1 mm. In a preferred embodiment, the lens curvature is selected to provide nearly collimated light from the photonic waveguide.

Figure 2:
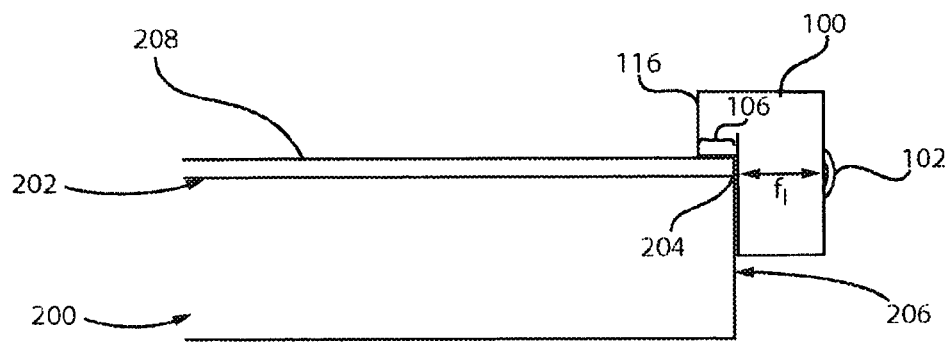
FIGS. 2-3 are diagrams of one embodiment of a photonic integrated circuit apparatus including a lens array coupling element.
Figure 3:
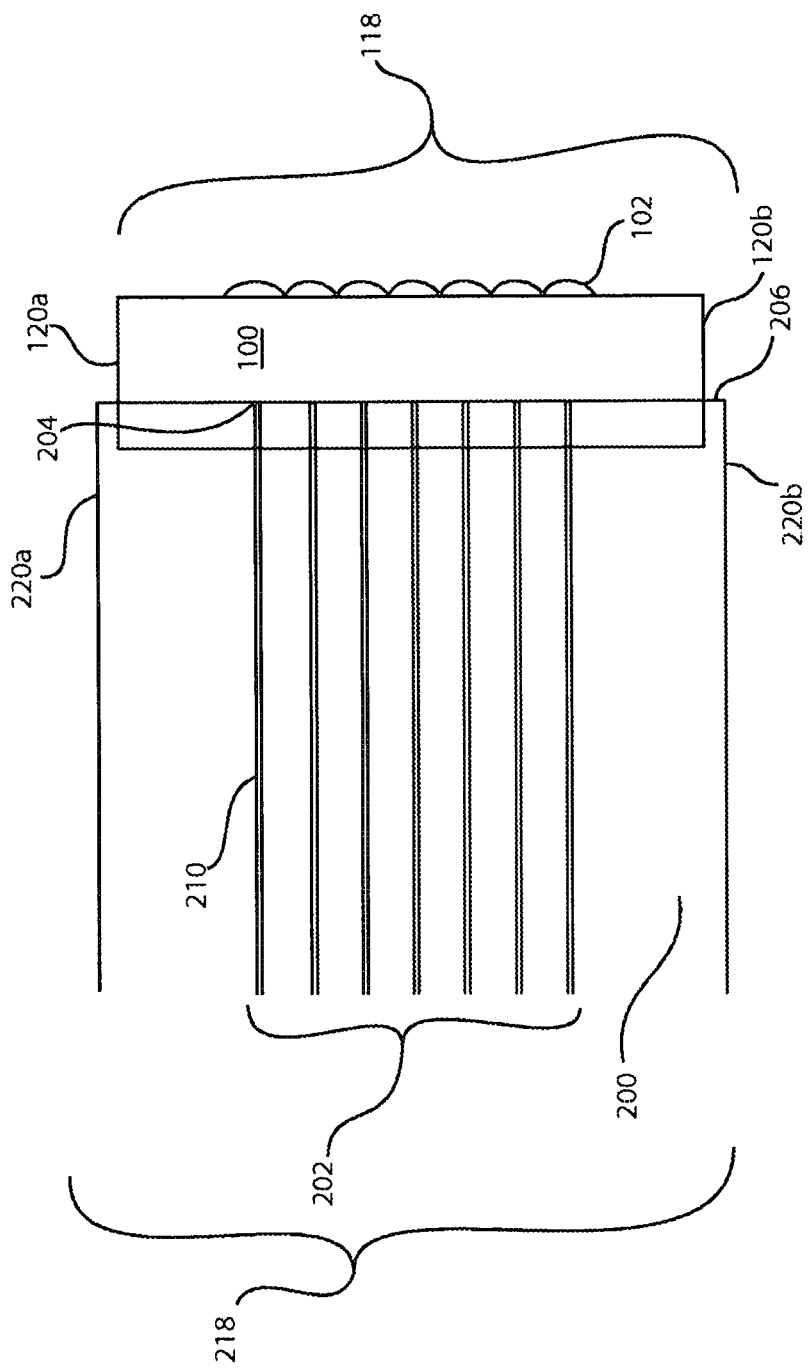
Figure 4:
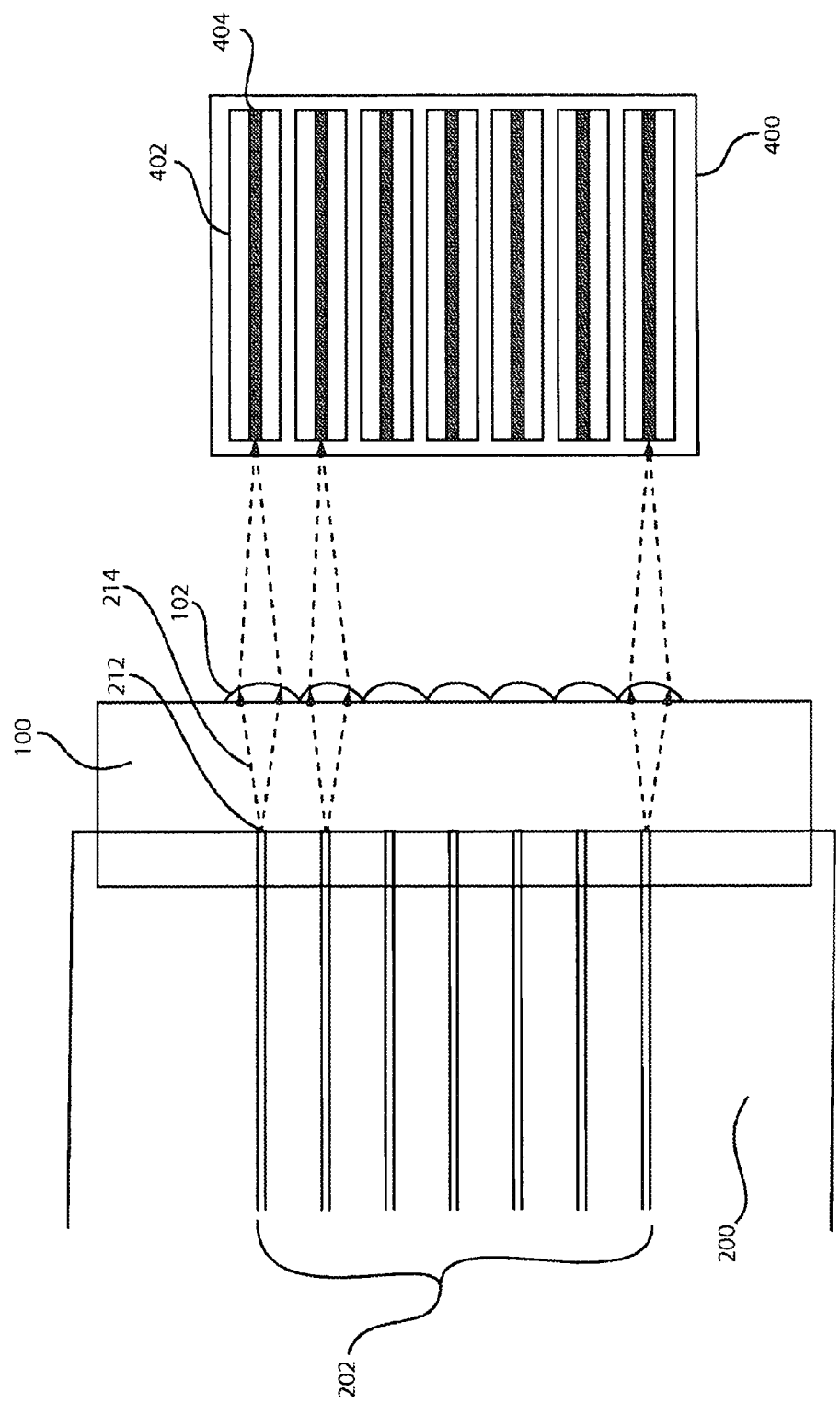
FIGS. 4-5 are diagrams of embodiments of photonic integrated circuit coupling systems.
Figure 5:
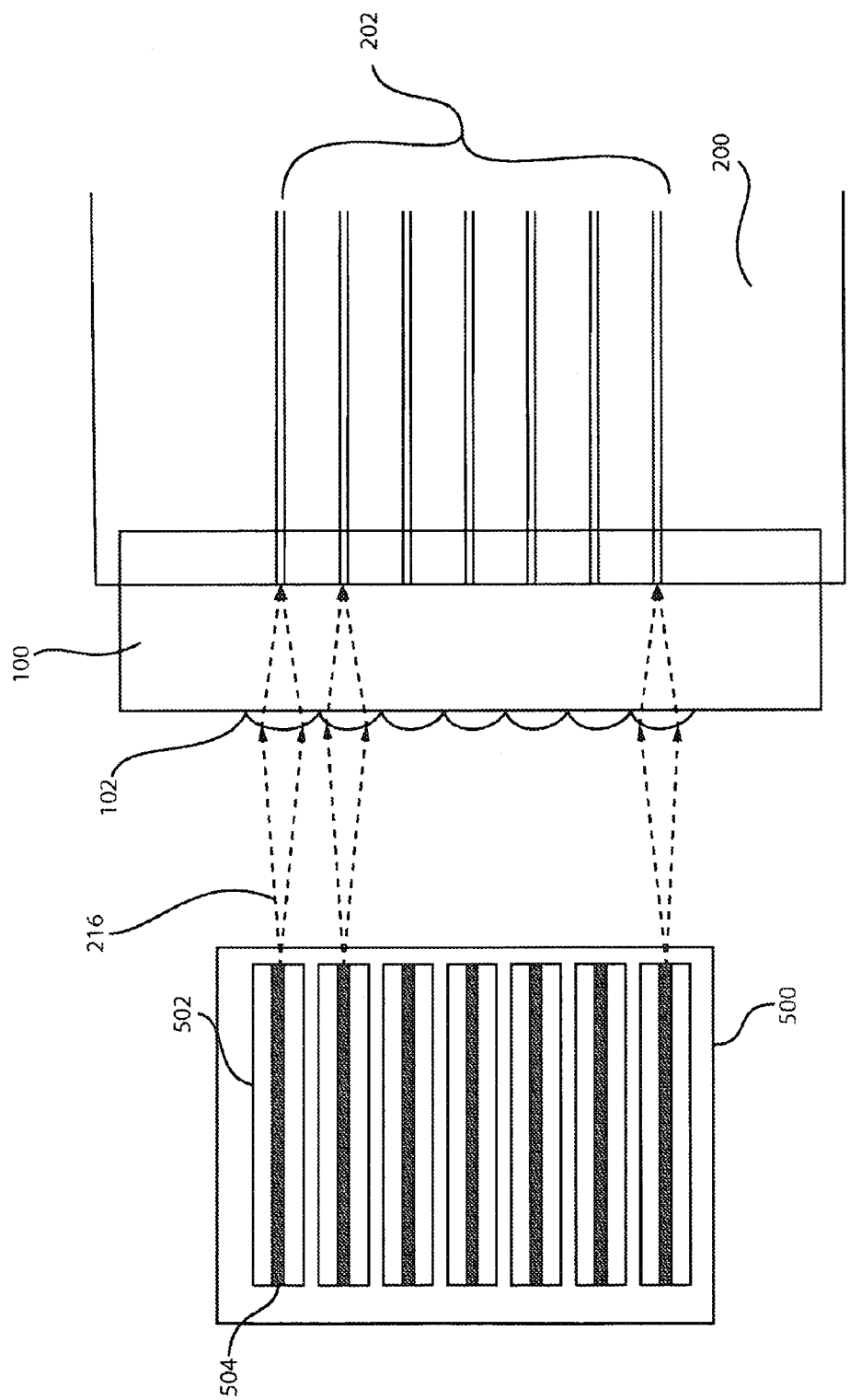

Referring now to FIGS. 4-5, with continuing reference to FIGS. 1-3, the operation of the lens array coupling element 100 is illustrated. In the examples shown in FIGS. 4-5, the coupling element 100 acts to couple the waveguide 202 of the photonic chip 100 to another optical device 400, 500. The optical device can be an array of single mode fibers, a waveguide 202 of another photonic chip 200, or a different optical device. Here, element 402 can represent a single mode fiber or an outer portion of a waveguide channel, while the element 404 can denote the core of an SMF or a waveguide channel. The diagram of FIG. 4 illustrates the effect of the lens array on light output from the waveguide 202. In particular, the edges of each of the waveguide channels are disposed at the focal points 212 of the corresponding lenses of the array 102 such that the light 214 exiting the waveguide 202 is modified so that the spot-size of the light is increased to match the size of the core 404 of the optical device 400. For example, the spot-size of the light can be magnified to two to ten times, preferable four times, its size after it exits the waveguide 202.

FIG. 5 illustrates a similar concept, except that the light rays 216 travel in the opposite direction, from the optical device 500 to the waveguide 202 of the photonic chip 200. Here, the same lens array coupling element 100 is attached to the photonic chip 200 to reduce the spot-size of the light 216 to the size of the core of the channels of the waveguide 202. The spot size of the light can be reduced to two to ten times, preferable four times, its size as it enters the waveguide 202. The device 500 can denote an array of single mode fibers, a waveguide 202 of another photonic chip 202, an array of lasers or a different optical device. The element 502 can represent a single mode fiber, an outer portion of a waveguide channel, or an outer portion of a laser, while the element 504 can denote the core of an SMF, of a waveguide channel or of a laser device.

Figure 6:
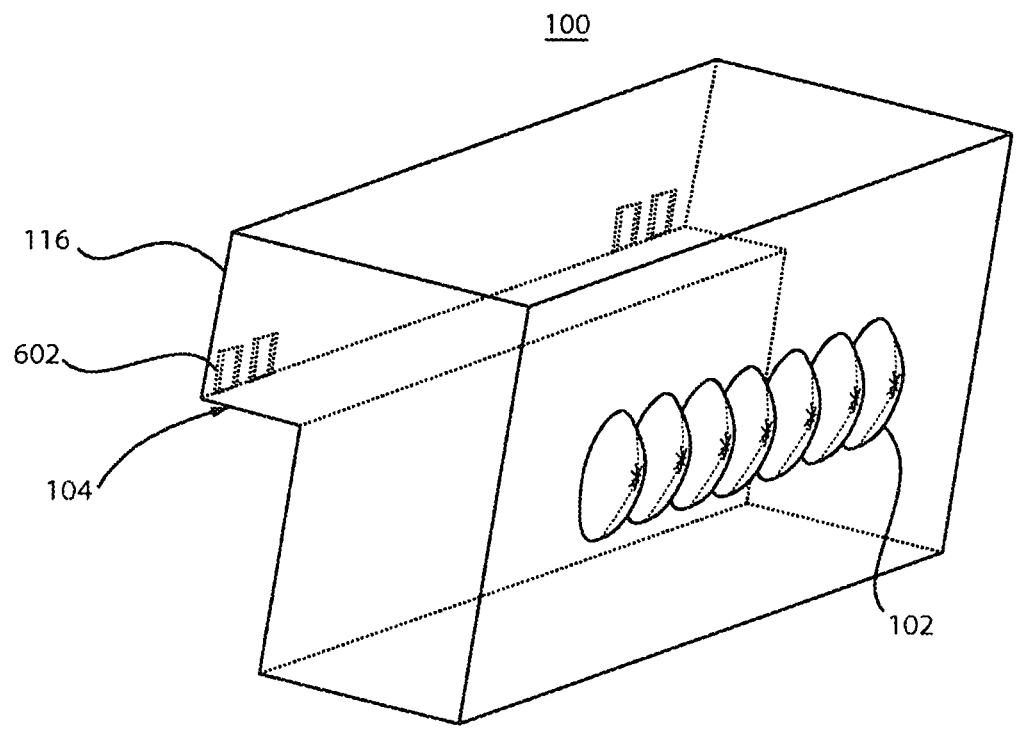
FIG. 6 is a three-dimensional view of a lens array photonic chip coupling element in accordance with an alternative exemplary embodiment.
Figure 7:
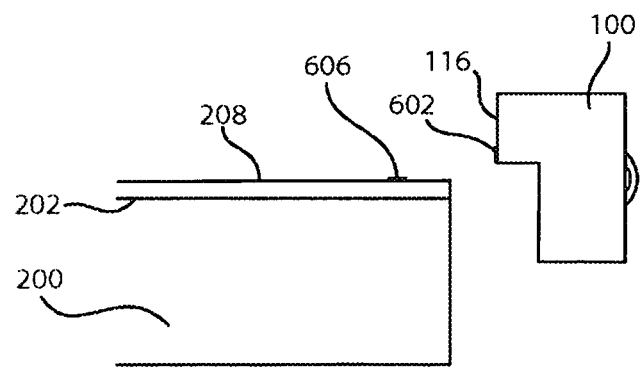
FIGS. 7-8 are diagrams of an embodiment of a photonic integrated circuit apparatus including an alternative lens array coupling element.
Figure 8:
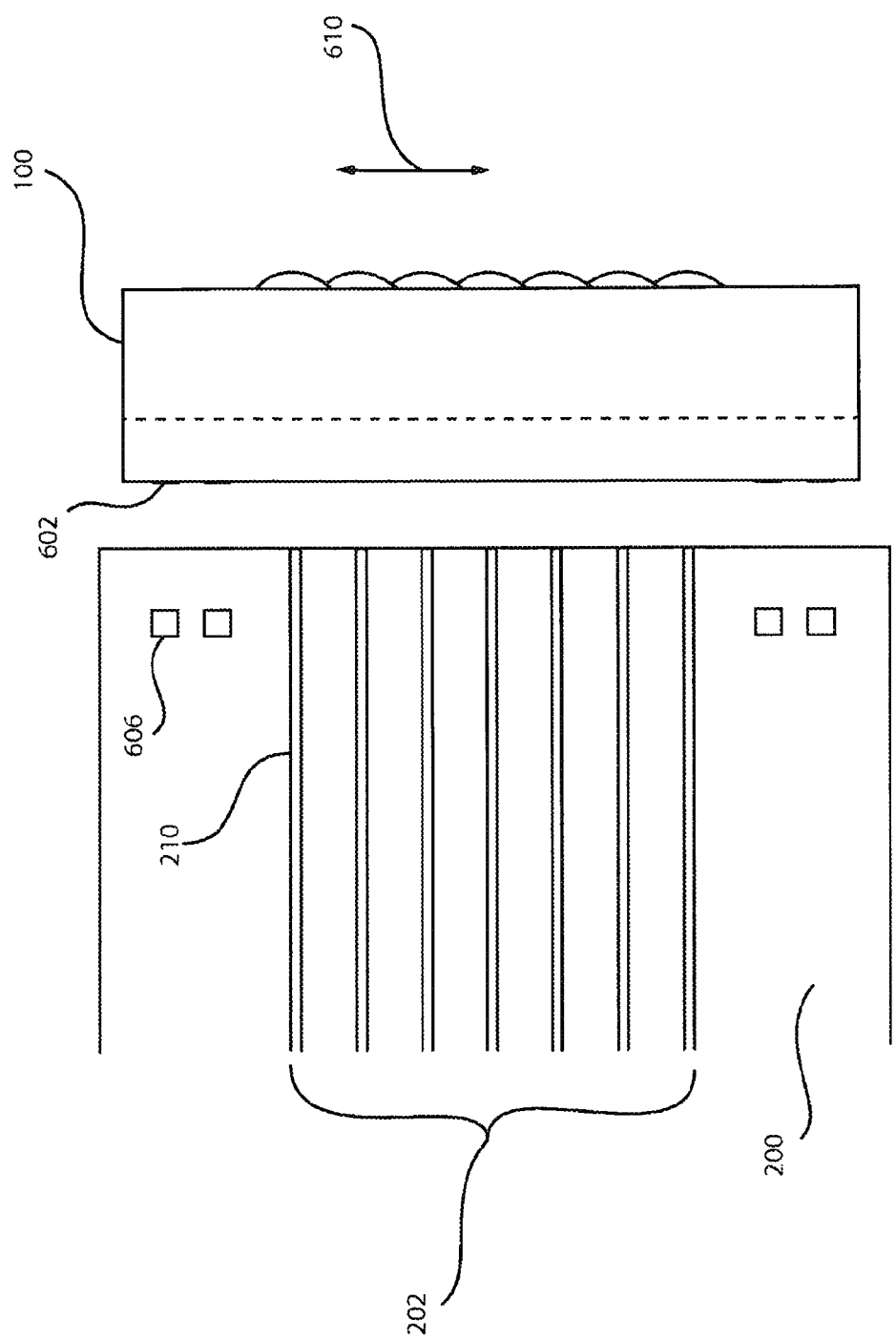

In accordance with other exemplary aspects of the present principles, the alignment of the lens array element 100 can be further simplified by incorporating mechanical passive alignment features in both the lens array element and the photonic chip. For example, complementary registration features can be precisely fabricated using photolithography. FIGS. 6-8 illustrate one implementation of registration features in accordance with the present principles. FIG. 7 provides an edge view of the photonic chip 200 while FIG. 8 provides a top view of the photonic chip 200. Here, metal pads 602 can be lithographically patterned and formed on a top surface 116 of the overhang 104 of the lens array element 100. In turn, complementary metal pads 606 can be formed on the top surface 208 of the photonic chip 200 using photolithography. The metal pads 602 on the lens array coupling element 100 can be co-fabricated with the metal pads 606 on the photonic chip. To bond the lens array coupling element 100 to the edge of the photonic chip 200, the metal pads 602 and 606 can be aligned to permit precise alignment in the lateral direction 610 between the focal points of the lenses in the lens array 102 and the edges of the channels 210 of the waveguide 202. For precision alignment, it is preferable to use an array of small bond pads rather than a few larger bond pads. For example, an array of 5-20 μm-sized pads with a spacing of 10-50 μm can be used. The number of pads can be from 2 to 50 or greater.

Figure 9:
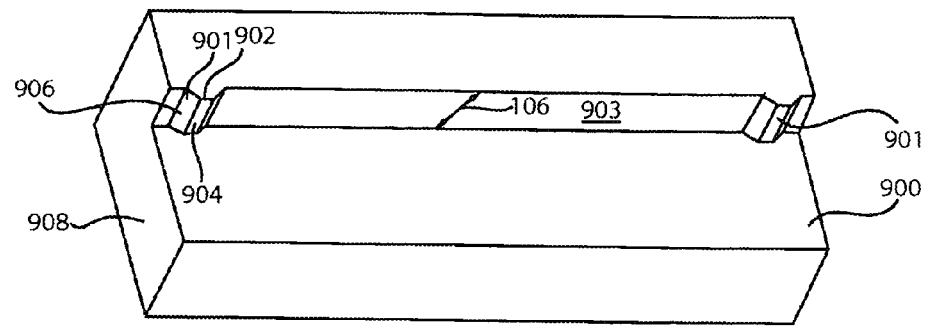
FIG. 9 is a three-dimensional view of a lens array photonic chip coupling element in accordance with an alternative exemplary embodiment.
Figure 10:
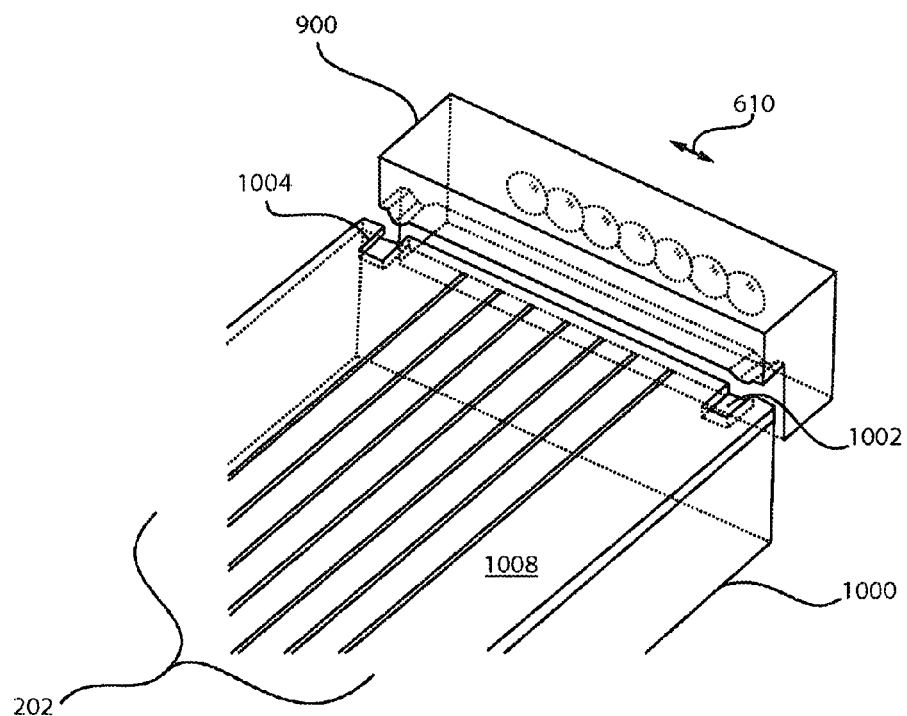
FIGS. 10-11 are diagrams of an embodiment of a photonic integrated circuit apparatus including an alternative lens array coupling element.
Figure 11:
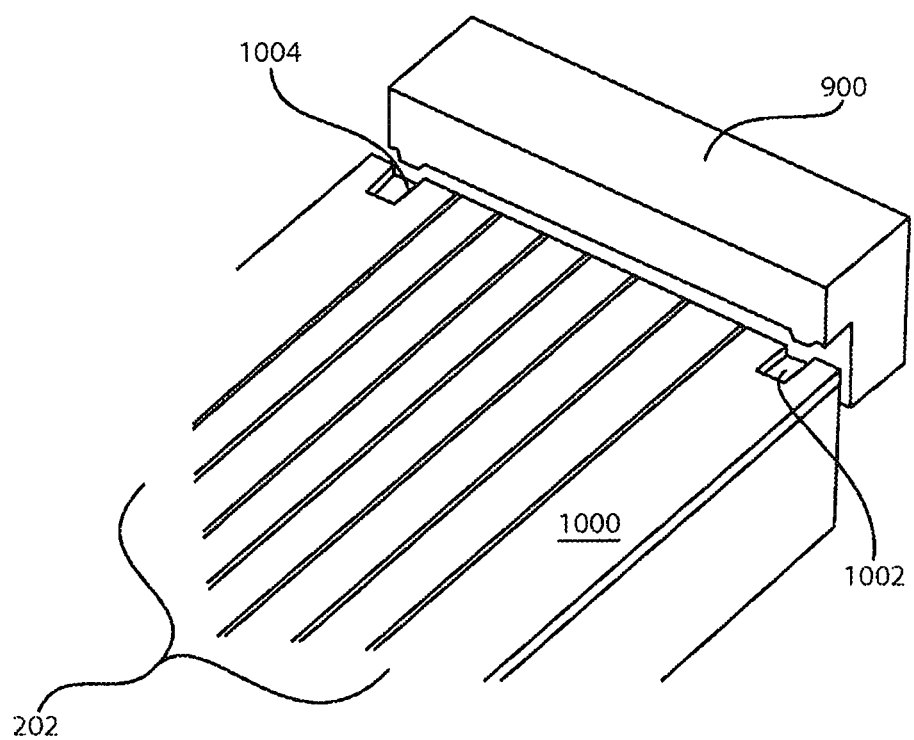

Referring now to FIGS. 9-11 with continuing reference to FIGS. 1-3 and 8, a lens array coupling element 900 that includes three-dimensional mechanical reference features 901 in accordance with an exemplary embodiment is illustrated. Here, the coupling element 900 is essentially the same as the coupling element 100 except that a plurality of reference features 901 have been added to the bottom surface 903 of the overhang 104 that is configured to abut the top surface 208 of the photonic chip 200. The reference feature 901 has a bottom surface 904 with a length 106 that is consistent with the depth of the overhang 104. As noted above, the depth of the overhang can be employed to align the edges of the waveguide to the focal length of the lenses in the array 102. The bottom surface of the reference feature 901 is flat and is configured to be parallel with the bottom surface 903 of the overhang of the coupling 900. The side surfaces 906 of the reference features 901 are angled so that the side surfaces 906 act as guides to permit proper mounting of the lens array coupling element 900 to the photonic chip. For example, as illustrated in FIG. 10, the photonic chip 1000 can include complimentary reference feature 1002 within the top surface 1008 of the chip. FIG. 11 provides a simplified view of the photonic chip 1000 and the lens array 900. Here, the complimentary feature 1002 is essentially a rectangular slot and includes a depth that is consistent with the depth of the surface 902 of the reference feature 901. In addition, the side surfaces 906 of the reference feature 901 of the lens array element 900 are configured to abut against the top edges 1004 of the complimentary features 1002 as the element 900 is lowered onto the chip 1000. In particular, the side surfaces 906 are angled in that they are not parallel to the side surfaces 908 of the lens array element. The angled feature of the surfaces 906 act to guide the lens array element 900 in the lateral direction 610 into a proper alignment with the waveguide channels 202 as the element 900 is lowered onto the chip 1000. In this way, the reference features 901 can further facilitate the precise alignment in the lateral direction between the focal points of the lenses in the lens array 102 and the edges of the channels 210 of the waveguide 202. The three-dimensional reference features 901 can be lithographically co-fabricated with the complimentary reference features 1002 of the photonic chip. In order to facilitate sub-micron placement accuracy, the three-dimensional reference features 901 and the complimentary reference features 1002 of the photonic chip can have dimensions on the order of 10 μm and can be fabricated using lithographic techniques with a resolution of less than 0.1 μm. For example, important dimensions of reference feature 1002 are the width and the depth of the surface. The width can have dimensions between 5 and 50 μm while the depth may be in the range of 1 to 50 μm. The length can range from 50 to 500 μm and, as indicated above, can be consistent with the depth 106 of the overhang. The complementary feature 901 on the photonic chip can have similar dimensions.

Figure 12:
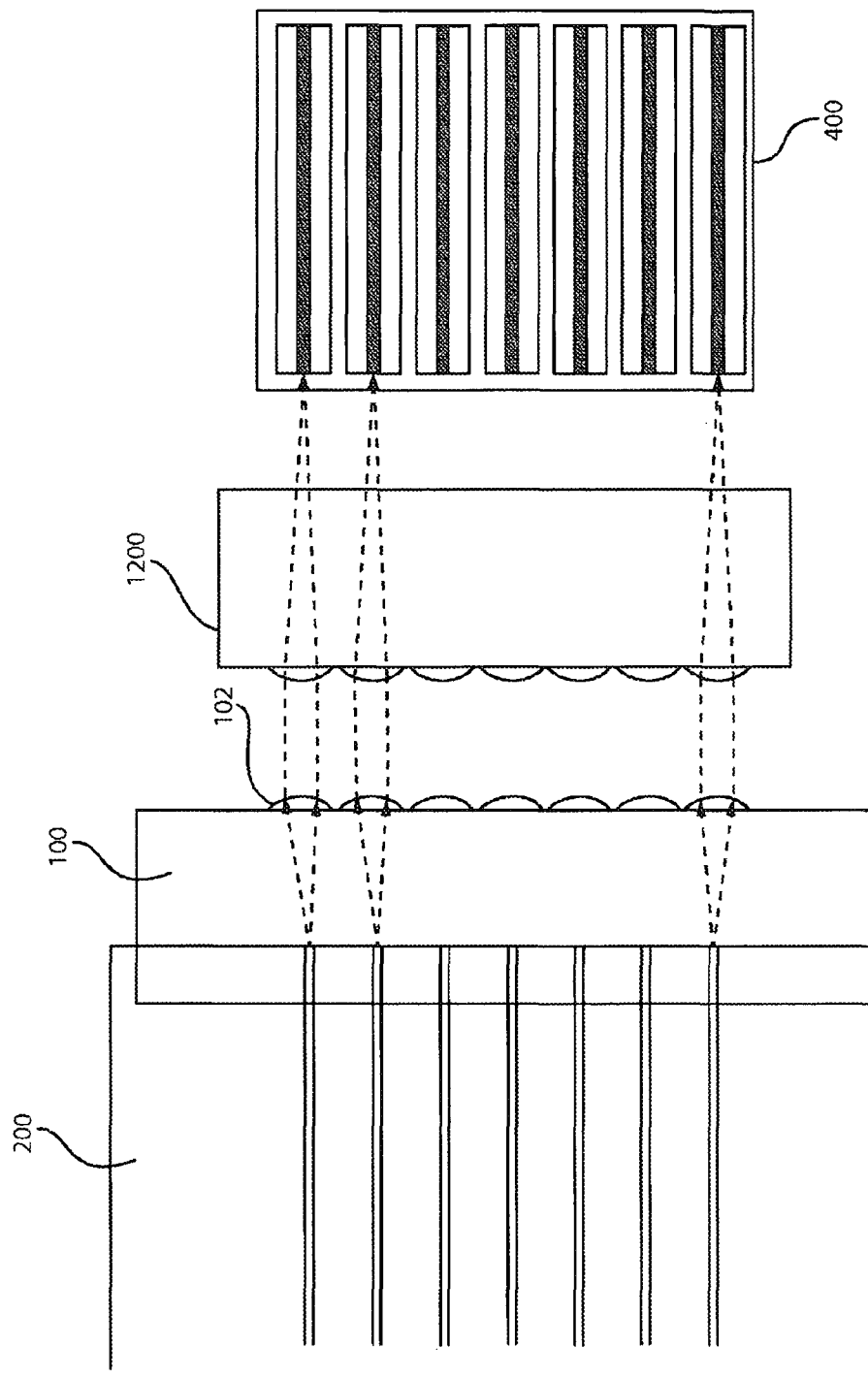
FIG. 12 is a diagram of an alternative photonic integrated circuit coupling system.
Figure 15:
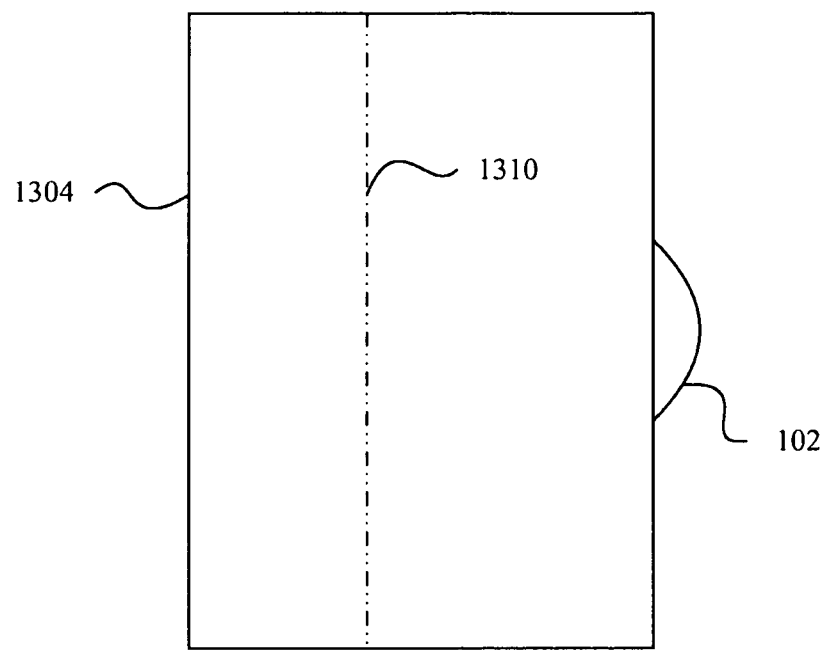
Figure 16:
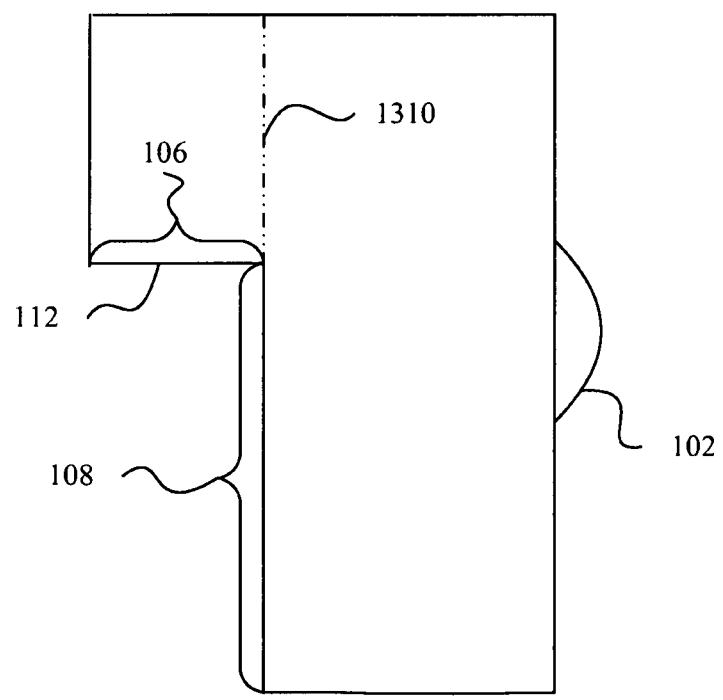
Figure 17:
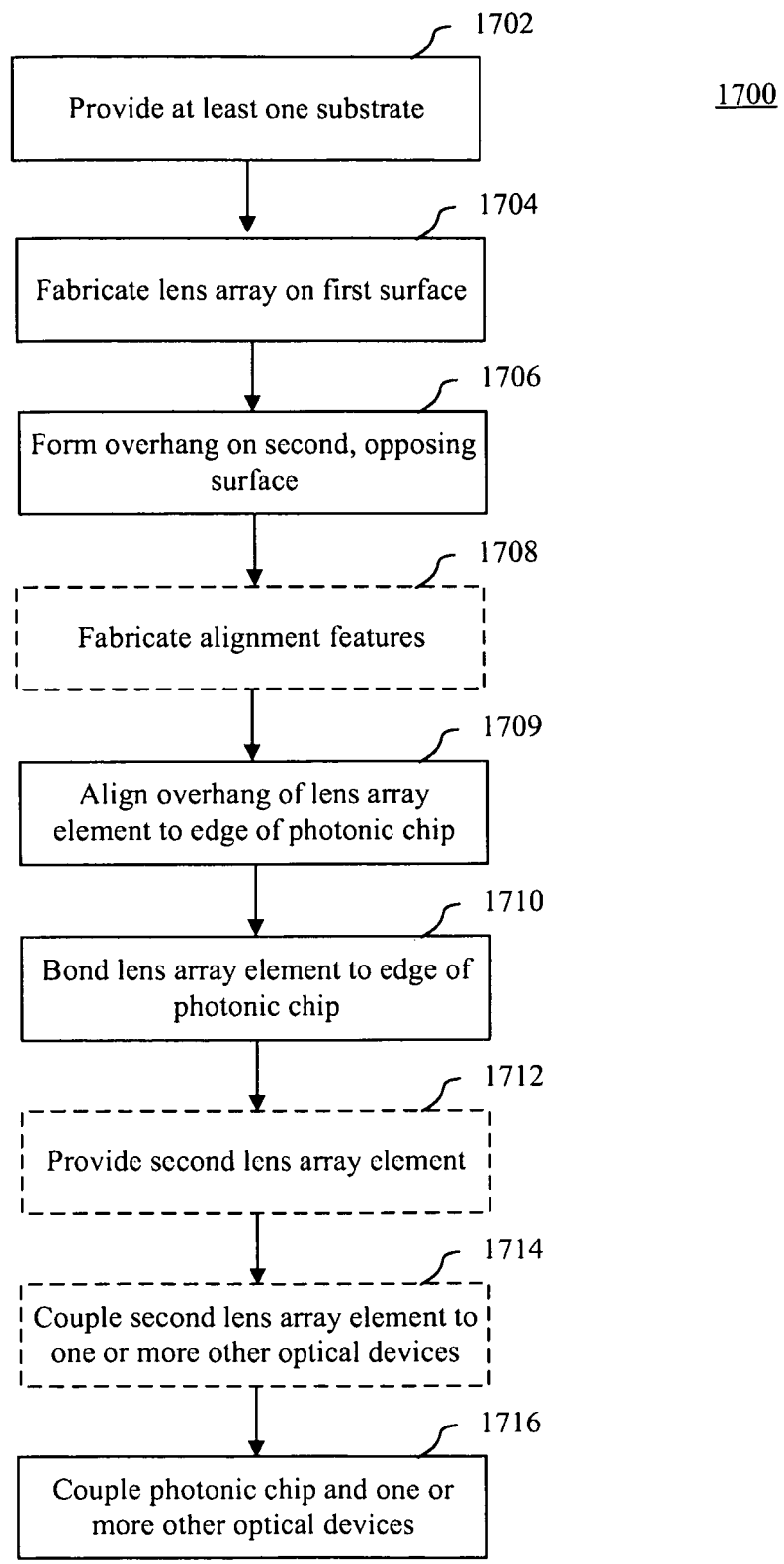
FIG. 17 a block/flow diagram of a method for fabricating a lens array photonic chip coupling element in accordance with one illustrative embodiment.

It should be noted that, in accordance with other exemplary aspects, a two-lens array optical coupling can be formed. For example, with reference to FIG. 12, an optical system is illustrated in which a first lens array element 100 is integrated on to a photonic chip 200 and a second lens array element 1200 is integrated on another optical device 400 and is aligned with the first lens array element 100. Although the lens array coupling element 100 with the corresponding photonic chip 200 is used here as an example, it should be noted that any of the registration and reference features described above can be included in the coupling element and the photonic chip. As illustrated in FIG. 12, a feature of the two-lens arrangement is that it can provide nearly collimated light between the two lenses. The collimated light greatly relaxes alignment tolerances between the photonic chip 200 and its lens array element 100 with the optical device 400 and its lens array 1200 to enable the use of a simple pick-and-place assembly. Precision assembly can be used to integrate the lens element 100 to the photonic chip by the means described above. Similarly, the second lens array 1200 should be aligned to the array of device 400 with a precision comparable to the core size. For example, for a fiber core, the alignment precision should be within about 9 μm. Once the two lens arrays are integrated into their respective optical device (for example, a photonic chip or fiber array), the collimated light between the two lens arrays provides efficient optical coupling between the two optical devices at relatively large offsets between the two lens arrays, for example up to 10 to 20 μm offset. These relaxed alignment tolerances arise from the collimated nature of the beam. With collimated light incident onto a lens, the lens will focus the light to its focal spot. This is true for light incident at any portion of the lens. Thus, an offset between the two lenses will cause an offset in the collimated light incident onto the second lens, but it will be directed to the focus spot. The two-lens arrangement can be used to optically couple the photonic chip 200 to a fiber array, another photonic chip or other types of optical elements. Although FIG. 12 illustrates an embodiment in which light travels from the photonic chip 100 to the optical device 400, the same lens array elements 100 and 1200 can be used for light traveling in the reverse direction, between the optical device and the photonic chip 200. In this case, the light between the array elements 100 and 1200 will also be collimated. Here, the optical device can be the optical device 500 and can denote an array of single mode fibers, a waveguide 202 of another photonic chip 202, an array of lasers or a different optical device. It should be noted that the lens array element 1200 can be any lens array element embodiment 100, 900 described herein if the optical device is a photonic chip. Otherwise, the element 1200 can essentially be a block with a lens array 102 but without an overhang 104. As indicated in FIG. 12, each lens of the element 1200 can receive or transmit light from or to a corresponding lens in the array 102 that is aligned with it.

Referring now to FIGS. 13-17, with continuing reference to FIGS. 1-12, a method 1700 for fabricating a lens array optical coupling element 100, 900 and for coupling a photonic chip to another optical device via the element 100, 900 will be described. As stated above, the coupling element 100, 900 can include at least one multi-lens array for coupling light from a photonic chip to another optical device. The lens array element can include a lens array on a first surface and an etched overhang on a second surface that provides precision alignment in the vertical direction between the focal point of the lenses and the edges of the channels of the waveguide on the photonic chip. Further, the length or depth 108 of the etched surface provides precise focal length control. In accordance with exemplary aspects, the fabrication of the lens array element 100, 900, the attachment of the element 100, 900 to the photonic chip and the coupling of the photonic chip to another device can be implemented using standard CMOS processes and techniques. The element 100, 900 is processed at a wafer-level scale and the method 1700 can be fully compatible with wafer processing.

The method 1700 can begin at step 1702, at which at least one substrate 1300 is provided. The substrate 1300 can be glass, a semiconductor, such as silicon, a polymer or a combination thereof. Any material that is transparent at the wavelength of the photonic circuits may be utilized. Current photonic chips operate between 1300 nm to 1600 nm, although other wavelengths are possible. At this wavelength range, most glasses are transparent, such as fused silica and borosilicate. Many semiconductors are also transparent, such as silicon, GaAs, InP, GaP, and other materials. An additional advantage of these materials (fused silica, borosilicate, silicon, GaAs, InP, and GaP) is their availability in wafer form—that is, polished substrates with a thickness between 0.2 and 1 mm and with diameters ranging between 50 mm to 300 mm. This permits the use of low-cost wafer processing, typically employed in semiconductor chip production, to fabricate the lens elements. For example, a standard 200 mm wafer (with a surface area greater than 30,000 $mm^2$) can provide about 20,000 lens arrays with a typical surface area of about 1.5 $mm^2$ (dimensions of 3 mm×0.5 mm).

At step 1704, the lens array 102 is fabricated on the first surface 1302 of the substrate 1300. In accordance with one exemplary aspect, the lenses of the array 102 can be refractive lenses that are molded into the surface of the substrate or are etched into the surface of the substrate using photolithography techniques. A process that can be used for lens fabrication can involve lithographic patterning of a photoresist deposited on the substrate wafer, resulting in discrete cylindrical photoresist features corresponding to each lens on the surface. The photoresist can then be reflowed at an elevated temperature to produce hemi-spherical shapes. The desired lens shape can be achieved by control of the diameter and the temperature profile of the reflow process. Following the photoresist lens formation, the entire substrate can be subjected to a reactive ion etch (RIE) process. The RIE process removes layers of material from both the substrate and the photoresist (lens). Once the photoresist (lenses) is fully consumed, the lens shape can be transferred into the substrate. For example, the substrate in FIG. 13 can be processed to fabricate the lens array 102 depicted in FIG. 14. Alternatively, the lenses can be diffraction lenses that are etched into the surface of the substrate.

At step 1706, the overhang 104 can be formed on the opposing surface 1304 of the substrate. For example, as illustrated in FIGS. 13 and 14, precision photolithography and etching techniques, similar to the techniques that can be applied at step 1704, can be employed to etch the opposing surface 1304 to the depth 106 or the depth 108, depending on the direction of the etch. In addition, the etching can be performed over an area of the surface of the substrate to form the overhang 104 with a height 108 or 106, respectively, depending on the direction of the etch. As described above, the depth 106 permits proper alignment of the focal length of the lenses of the array 102 to the edge of the channels of the waveguide 202, while the height 108 permits the vertical alignment of the focal point of the lenses of the array 102 to the edge of the channels of the waveguide 202. Thus, the overhang 104 can simultaneously provide a precise placement for two axes: the optical axis along the waveguide propagation direction and the vertical height off of the photonic chip surface 208.

Optionally, at step 1708, alignment features can be fabricated above or on the overhang 104. Here, the step 1708 can be performed simultaneously with the step 1706. As indicated above, registration features 602 can be formed on a surface 116 that is above and normal to the vertical stop surface 112 of the overhang 104 or reference features 901 can be formed on the vertical stop surface 112 of the overhang 104. For example, the bottom 904 and angled side 906 surfaces can be formed to fabricate the reference features 901. These can be fabricated at the same step as the formation of the overhang. Further, the complimentary registration or reference features 606 or 1002 can be co-fabricated with features 602 or 901, respectively, on the top surface 208 of the photonic chip. Two lithographic steps can be used to fabricate the metal pad 602 and the 3-D mechanical stop feature 901. These two steps can be processed sequentially and each can involve photoresist processing to define the features. For metal pads 602, the defined feature can be metalized with Cu or Al and an adhesion layer of Ti or Cr. For mechanical feature 901, the feature can be patterned directly into the overhang and the same RIE step can be used to etch both the overhang and the mechanical feature 901 simultaneously. Here, the lithography and etching techniques used to fabricate the registration or reference features on both the lens array element and the photonic chip can achieve a relative accuracy of less than 0.1 μm. As such, the overhang can provide an accuracy of approximately 0.1 μm for assembly of the lens array element to the photonic chip. It should be noted that although the embodiments depicted in FIGS. 9-11 illustrate the features 901 as being etched onto the coupling element 900, in alternative embodiments, the features 901 can be etched onto the photonic chip in place of features 1002. Further, in this case, the features 1002 can be etched into the overhang of the coupling element 900 in place of the features 901.

At step 1709, the overhang of the lens array element 100, 900 can be aligned to the side edge surface 206 the photonic chip 200 and to the edge 204 the waveguide 202. For example, as indicated above, the depth 106 of the vertical stop surface 112 can be employed to horizontally align the edge 204 of the waveguide with the focal length of the lens array. Moreover, the vertical stop surface 112 can also be employed to vertically align focal points of the lens array with the edge of the waveguide, while the surface 114, which is normal to the surface 112, can act as an edge stop surface with respect to the edge 206 of the photonic chip 200. Furthermore, as discussed above, the optional reference features 602/606 or 901/1002 can be utilized to effect the lateral alignment of the lens array with the edge of the waveguide. For example, the protruding reference features 901 on the lens array element 100 can be lowered into and disposed in the slots 1002 of the photonic chip 200. In particular, when the lens array element 100 is lowered, the angled sides 906 can slide on the edges 1004 of the slots 1002, thereby guiding the lens array element 100 for lateral alignment between the focal points of the lens array and the edge of the waveguide. Alternatively, referring to FIG. 3, if the reference features 602/606 or 901/1004 are not employed, the length 118 of the lens array element 100 can be configured to match the width 218 of the photonic chip 200. For example, a substrate with such a matching length can be provided at step 1702 or a larger substrate can be provided at step 1702 and etched at steps 1704 or 1706 to the matching length. In this case, the side surfaces 120a and 120b of the lens array element 100 can be aligned with the side surfaces 220a and 220b, respectively, of the photonic chip 200 to implement step 1709.

At step 1710, the lens array element 100, 900 can be bonded to the photonic chip 200, 1000. As described above, the overhang 104 and the optional registration or reference features can be employed to position the array element 100, 900 and the photonic chip 200, 1000 such that the edges of the channels of the waveguide 202 are precisely aligned with the focal point of the lenses in the array 102. Bonding of the lens array to the photonic chip can be carried out using an adhesive, such as epoxy, or by soldering, for example using the metal pads 602 and 606 described above. In both cases, for the embodiment 900, the alignment is defined by the 3-D features etched into the lens array (901) and the photonic chip (1002). The adhesive or solder can be used to anchor the two components together, while the 3-D etched features provide the sub-micron registration between the two components.

Optionally, at step 1712 a second lens array element 1200 can be provided to implement a two-lens array coupling system, for example, as described above with regard to FIG. 12.

Optionally, at step 1714, the second lens array element 1200 can be coupled to one or more other optical devices 400, 500. For example, if the other optical device is another photonic chip 200, 1000 with a corresponding waveguide 202, the lens array element 1200 can be coupled to the photonic chip as described above with respect to step 1710.

At step 1716, the photonic chip 200, 1000 can be coupled to one or more other optical devices 400, 500 via the lens array element 100, 900, for example, as described above with respect to FIGS. 4, 5 and/or 12. Although the lens array element 100, 900 is precisely aligned with the waveguide 200, the alignment of the lens array element to the other optical device 400, 500 is substantially relaxed due to the use of the lens array 102. For example, if the optical device to which the photonic chip 200, 1000 is coupled is a fiber array, the lens to fiber alignment is relaxed by a magnification factor. For example, for a magnification lens that provides a magnification of five times, the alignment tolerance is approximately +/−2.5 to 3 μm as opposed to the 0.5 μm accuracy required for butt coupling. Similarly, the accuracy in the fabrication of the fiber array is also relaxed to similar tolerances. Furthermore, using the two-lens optical coupling system with nearly collimated light between the lenses can provide alignment tolerances of +/−10 μm or more.

It should be noted that although the use of only a single substrate has been described for the fabrication of the lens array coupling element 100, 900, the coupling element 100, 900 can be fabricated using two different substrates that are composed of the same or different materials. As noted above, the materials can be glass, a semiconductor, such as silicon, a polymer or a combination thereof. Here, the two wafers can be laminated or fused together along interface 1310 in FIGS. 13-16 and can be provided as the substrate in step 1702. The use of two wafers in this manner can improve the surface quality of the etched overhang, as the interface 1310 can act as an etch stop (e.g., an oxide) for the fabrication of the overhang at step 1706. This results in a smooth surface for optimum optical interfacing. It should be noted that all lithographic patterning described herein is compatible with wafer-scale processing on both the top and bottom surfaces of the substrate.

Having described preferred embodiments related to lens array optical couplings to photonic chips (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photonic integrated circuit apparatus comprising:
   a photonic chip including a waveguide that has apertures at a side edge surface of the photonic chip; and
   a lens array coupling element mounted on a top surface of the photonic chip and on the side edge surface, said coupling element including a lens array configured to modify spot sizes of light traversing to or from the waveguide and including an overhang on a side of the coupling element that opposes the lens array and that abuts the top surface of the photonic chip, said overhang including a vertical stop surface that has a depth configured to horizontally align an edge of the waveguide and a surface of the lens array coupling element with a focal length of the lens array and that vertically aligns focal points of the lens array with the edge of the waveguide.

2. The apparatus of claim 1, wherein the overhang includes a second surface having a height configured to effect the vertical alignment with the focal points and the edge of the waveguide.

3. The apparatus of claim 1, wherein the overhang further comprises at least one reference feature and wherein the top surface of the photonic chip further comprises at least one complementary feature that is aligned with said at least one reference feature and wherein said features are configured to provide a reference for lateral alignment between the focal points of the lens array and the edge of the waveguide.

4. The apparatus of claim 3, wherein the at least one reference feature is disposed on a third surface that is above and is normal to the vertical stop surface and wherein the at least one reference feature and the at least one complementary feature are conductive pads.

5. The apparatus of claim 3, wherein the at least one complimentary feature is at least one slot and wherein the at least one reference feature protrudes from the vertical stop surface and is disposed in the at least one complementary feature.

6. The apparatus of claim 5, wherein the at least one reference feature includes angled sides that are configured to slide on edges of the at least one complimentary feature to act as guides for lateral alignment between the focal points of the lens array and the edge of the waveguide.

7. A photonic integrated circuit coupling system comprising:
   a photonic chip including a waveguide that has apertures at a side edge surface of the photonic chip;
   an other optical device configured to transmit or receive light to or from the apertures of the waveguide; and
   a lens array coupling element mounted on a top surface of the photonic chip and on the side edge surface, said coupling element including a lens array configured to modify spot sizes of the light traversing between the waveguide and the other optical device, said coupling element further including an overhang on a side of the coupling element that opposes the lens array and that abuts the top surface of the photonic chip, said overhang including a vertical stop surface that has a depth configured to horizontally align an edge of the waveguide and a surface of the lens array coupling element with a focal length of the lens array and that vertically aligns focal points of the lens array with the edge of the waveguide.

8. The system of claim 7, wherein the other optical device is a second photonic chip including a second waveguide, is a fiber array or is a laser array.

9. The system of claim 8, wherein said other optical device includes a second lens array that is aligned with the lens array of the coupling element such that the light is collimated between the second lens array and the lens array of the coupling element.

10. The system of claim 7, wherein the overhang further comprises at least one reference feature and wherein the top surface of the photonic chip further comprises at least one complementary feature that is aligned with said at least one reference feature and wherein said features are configured to provide a reference for lateral alignment between the focal points of the lens array and the edge of the waveguide.

11. The system of claim 10, wherein the at least one reference feature is disposed on a third surface that is above and is normal to the vertical stop surface and wherein the at least one reference feature and the at least one complementary feature are conductive pads.

12. The system of claim 10, wherein the at least one complimentary feature is a slot and wherein the at least one reference feature protrudes from the vertical stop surface and is disposed in the at least one complementary feature.

13. The system of claim 12, wherein the at least one reference feature includes angled sides that are configured to slide on edges of the at least one complimentary feature to act as guides for lateral alignment between the focal point of the at least one lens and the edge of the waveguide.

14. A photonic chip coupling device comprising:
   a first portion including at least one lens configured to modify a spot size of light traversing between an optical device and a waveguide that is at a side edge surface of a photonic chip and that directs light horizontally; and
   a second portion on an opposing side of the coupling device with respect to the first portion, the second portion including an overhang with a first surface having a depth configured to horizontally align an edge of the waveguide and a surface of the coupling device with a focal length of the at least one lens, wherein the first surface is further configured to abut a top surface of the photonic chip and act as a vertical stop such that the overhang vertically aligns a focal point of the at least one lens with the edge of the waveguide at the side edge surface of the photonic chip.

15. The device of claim 14, wherein the overhang includes a second surface having a height configured to effect the vertical alignment with the focal point and the edge of the waveguide.

16. The device of claim 14, wherein the overhang further comprises at least one reference feature configured to provide a reference for lateral alignment between the focal point of the at least one lens and the edge of the waveguide.

17. The device of claim 16, wherein the at least one reference feature is at least one conductive pad that is disposed on a third surface that is above and is normal to the first surface.

18. The device of claim 16, wherein the at least one reference feature is on the first surface and includes a bottom surface that has a length that is equal to the depth of the first surface.

19. The device of claim 16, wherein the at least one reference feature includes angled sides that are configured to act as guides for lateral alignment between the focal point of the at least one lens and the edge of the waveguide.

* * * * *